United States Patent
Richter et al.

(10) Patent No.: US 7,489,563 B2
(45) Date of Patent: Feb. 10, 2009

(54) MEMORY DEVICE WITH ADAPTIVE SENSE UNIT AND METHOD OF READING A CELL ARRAY

(75) Inventors: Detlev Richter, München (DE); Mirko Reissmann, Ottendorf-Okrilla (DE); Volker Zipprich-Rasch, Dresden (DE); Gert Köbernik, Unterhaching (DE); Uwe Augustin, Dresden (DE); Konrad Seidel, Dresden (DE); Andreas Kux, Haar (DE); Hans Heitzer, München (DE); Daniel-André Löhr, Dresden (DE); Sören Irmer, Radebeul (DE)

(73) Assignee: Qimonda Flash GmbH & Co. KG, Dresden (DE)

( * ) Notice: Subject to any disclaimer, the term of this patent is extended or adjusted under 35 U.S.C. 154(b) by 193 days.

(21) Appl. No.: 11/668,753

(22) Filed: Jan. 30, 2007

(65) Prior Publication Data

US 2008/0181012 A1    Jul. 31, 2008

(51) Int. Cl.
*G11C 7/00*    (2006.01)

(52) U.S. Cl. .............................. 365/189.01; 365/189.07

(58) Field of Classification Search ............ 365/189.01, 365/189.07, 185.22
See application file for complete search history.

(56) References Cited

U.S. PATENT DOCUMENTS

| | | | |
|---|---|---|---|
| 6,456,536 B1 * | 9/2002 | Sobek et al. ............ | 365/185.28 |
| 6,768,165 B1 * | 7/2004 | Eitan .......................... | 257/324 |
| 7,167,395 B1 | 1/2007 | Kobernik et al. | |

\* cited by examiner

*Primary Examiner*—Son Dinh
(74) *Attorney, Agent, or Firm*—Edell, Shapiro & Finnan, LLC

(57) ABSTRACT

A memory device is provided including memory cells that are capable of switching between at least two states, where the threshold of a sense signal for detecting the current state depends on a data content of the memory cell. Parallel to a user data block, a primary control word including a predetermined number of bits of a first state is stored in a check section of the cell array. The check section is read by applying sense signals of different amplitudes, where in each case a secondary control word is obtained. By checking in each secondary control word the number of bits of the first state, the margins of the current sense signal amplitude towards the sense window limits may be checked and the sense signal amplitude may be adapted permanently to a sense window drift, so as to enhance the reliability of the memory device.

37 Claims, 4 Drawing Sheets

MEMORY DEVICE WITH ADAPTIVE SENSE UNIT AND METHOD OF READING A CELL ARRAY

FIELD

The embodiments described below relate to a method and apparatus for reading a cell array of a memory device.

BACKGROUND

Conventional non-volatile memory devices broadly fall into two different categories, floating gate and trapping layer. Trapping layer memory cells, such as SONOS-memories or NROM-memories, have an n-channel FET with the gate dielectric replaced by a trapping layer and two barrier layers sandwiching the trapping layer. The trapping layer is the storage element of the memory cell. The barrier layers inhibit direct tunneling of charge carriers from and to the non-conductive trapping layer. Floating gate memory cells comprise usually an n-channel FET with a floating gate sandwiched between a dielectric tunnel layer separating the floating gate from the transistors channel region and a dielectric barrier layer between the floating gate and the control gate that is connected to the address circuitry. The floating gate is the storage element of the memory cell. The tunnel dielectric and the dielectric barrier layer insulate the conductive floating gate. Each memory cell may be programmed by injecting charge carriers into the trapping layer or the floating gate from either the control gate or the channel region. The memory cell is erased by removing or compensating the previously injected charge. The embodiments of the current invention are not limited to these two different categories of non-volatile memories and may cover other types of solutions.

Memory cells may be based on a binary or a multi-level programming/sensing scheme, for example a 4-bit per cell programming/sensing scheme. According to a binary programming/sensing scheme, the n-channel FET switches from a non-conductive state to a conductive state when a read voltage applied to the control gate exceeds a threshold voltage. The n-channel FET returns to the non-conductive state when the read voltage falls below the threshold voltage. A negative charge that is stored in the trapping layer functions as a negative bias of the control gate and shifts the threshold voltage towards higher voltage values.

The state of the memory cell is detected by applying a suitable read voltage to the control gate and checking whether the FET is conductive or not. In a binary sensing scheme, the read voltage is selected such that, on one hand, the read voltage is high enough to ensure that all erased memory cells are conductive and that, on the other hand, the read voltage is low enough to ensure that none of the programmed memory cells are non-conductive.

According to a 4-bit per cell programming/sensing scheme, three different amounts of charge are trapped in the same location or equivalent amounts of charge are trapped in different locations of the trapping layer. Three different voltage levels are used to define four different ranges or states. Each of the four different ranges or states represents a unique arrangement of a pair of bits (e.g., 00, 01, 10 or 11).

The threshold voltage for each memory cell depends, to some extent, on geometric and physical properties. For example, channel length, channel doping profile, and barrier layer thickness vary from memory cell to memory cell. Each cell array with a plurality of memory cells shows a representative threshold voltage distribution. A cell array's sense window is determined by the distance between the threshold voltage distributions for the erased state of the cell array and the programmed state. Wide sensing windows minimize the number of read errors. In order to achieve wide sensing margins, the read voltage is typically set at in the middle of the sense window.

During the course of a memory's lifetime, programmed memory cells exhibit marked retention loss and the margin between the read and write voltage may become narrower. At or near the same time, the threshold voltage distribution of the erased memory cells may show a downward trend. Adjusting the read voltage to reflect the change in the sense window may ensure that there are sufficient margins between the erased and programmed state of the cell array during its operating product lifetime.

FIG. 1 is a diagram showing exemplary threshold voltage distributions for a cell array comprising a plurality of binary memory cells at the beginning and towards the end of lifetime. The diagram plots a memory cell count Nr against a test voltage Vtest for the programmed state and the erased state at the beginning and at the end of lifetime, respectively. The abscissa indicates a test voltage Vtest and is scaled to a step voltage Vstep. The ordinate indicates the respective memory cell count Nr. The dotted lines refer to threshold voltage distributions 11a, 12a at the beginning of the life cycle, while the continuous lines refer to the corresponding threshold voltage distributions 11b, 12b at the end of lifetime.

A first threshold voltage distribution 11a shows the number of erased memory cells switching to the conductive state at the respective test voltage at the beginning of the lifetime of the memory device. A second threshold voltage distribution 12a indicates the number of programmed memory cells that switch to the conductive state at the respective test voltage at the beginning of the lifetime of the memory device. Each curve 11a, 12a represents essentially a gaussian distribution, where the distribution for the programmed state may tend to be wider than the distribution for the erased state. The first curve 11a referring to erased memory cells has a lower distribution edge VtLL and an upper distribution edge VtHL. The second plot 12a referring to programmed memory cells has a lower distribution edge VtLH and an upper distribution edge VtHH.

By applying a test voltage lower than VtLL to a cell array that comprises both erased and programmed memory cells, none of the memory cells, whether programmed or erased, is conductive and no information can be obtained from the cell array. Applying a test voltage higher than VtLL but lower than VtHL would cause only a portion of the erased cells to becoming conductive. By applying a test voltage higher than VtHH, all programmed memory cells become conductive and no information can be obtained from the cell array. Applying a test voltage lower than VtHH but higher than VtLH would cause at least a portion of the programmed cells to become conductive. For determining the correct information from each memory cell, the read voltage must be within the range of an initial "sense window" W1 between VtHL and VtLH. Typically the initial application read voltage is set equal to the arithmetic mean of VtLH and VtHL at the beginning of the life cycle.

The third curve 11b and the fourth curve 12b illustrate the threshold voltage distributions of the same cell array at the end of lifetime of the cell array. Both distribution curves 11b, 12b show a shift towards smaller threshold voltages, whereby the shift is greater for the threshold voltage distribution of programmed cells. The initial read voltage Vrdinit may be outside the final sense window W2. Without adapting the application read voltage to the shift of the threshold voltage toward the end of lifetime the memory device would detect an increasing portion of the programmed bits as being erased. Setting the application read voltage near to VtLH such that the read voltage would be within both the initial sense window W1 and the final sense window W2 would increase sensitivity towards disturbances at the beginning of life time. A rough method for tracking the read voltage may be to predict the actual sense window by the number of program/erase cycles yet performed by the cell array. As a read latency should be as short as possible, the read voltage should continuously track the actual sense window.

SUMMARY

A method of reading a memory cell array comprises providing the memory cell array with user data and check sections, each of which comprises memory cells that may exhibit at least two states that are distinguishable by the response to a sense signal. The primary control word may be written into one of the check sections. A primary control word comprises a predetermined primary number of bits of a predetermined state. New secondary control words are generated by changing a sense signal applied to the check section. A lower and an upper range for a sense signal window is set by analyzing the new secondary control words. An application sense signal is changed in accordance with a predetermined relationship between the lower and the upper range for the sense signal window. The changed application sense signal may be applied to read the user data section of the cell array.

According to another embodiment, a method of reading a memory cell array comprises providing a memory cell array with a user data section and a check section, where each comprises memory cells with at least two distinguishable states. A primary control word is written into the check section, where the primary control word comprises a predetermined primary number of bits of a predetermined state. Different read voltages are applied to read secondary control words from the check section. The secondary control words are analyzed with respect to the primary control words to determine an upper and a lower sense window limit. The read voltage is set in accordance with a predetermined relationship between the lower and the upper sense window limits in order to read the user data section.

According to a further embodiment, a memory device comprises a cell array, an adjustable read voltage source and a sense unit. The cell array comprises a user data and a check section, each of which comprise memory cells. The adjustable read voltage source is configured to supply different read voltages to the check section to generate secondary control words. The sense unit is adapted to read the secondary control words at the different read voltages to determine a lower and an upper limit of the read voltage.

These and other embodiments will become apparent upon consideration of, for instance, the following definitions, descriptions and descriptive figures, wherein like reference numerals in the various figures are utilized to designate like components. While these descriptions go into specific details, it should be understood that variations may and do exist and would be apparent to those skilled in the art based on the descriptions herein.

DETAILED DESCRIPTION

Figure 1:
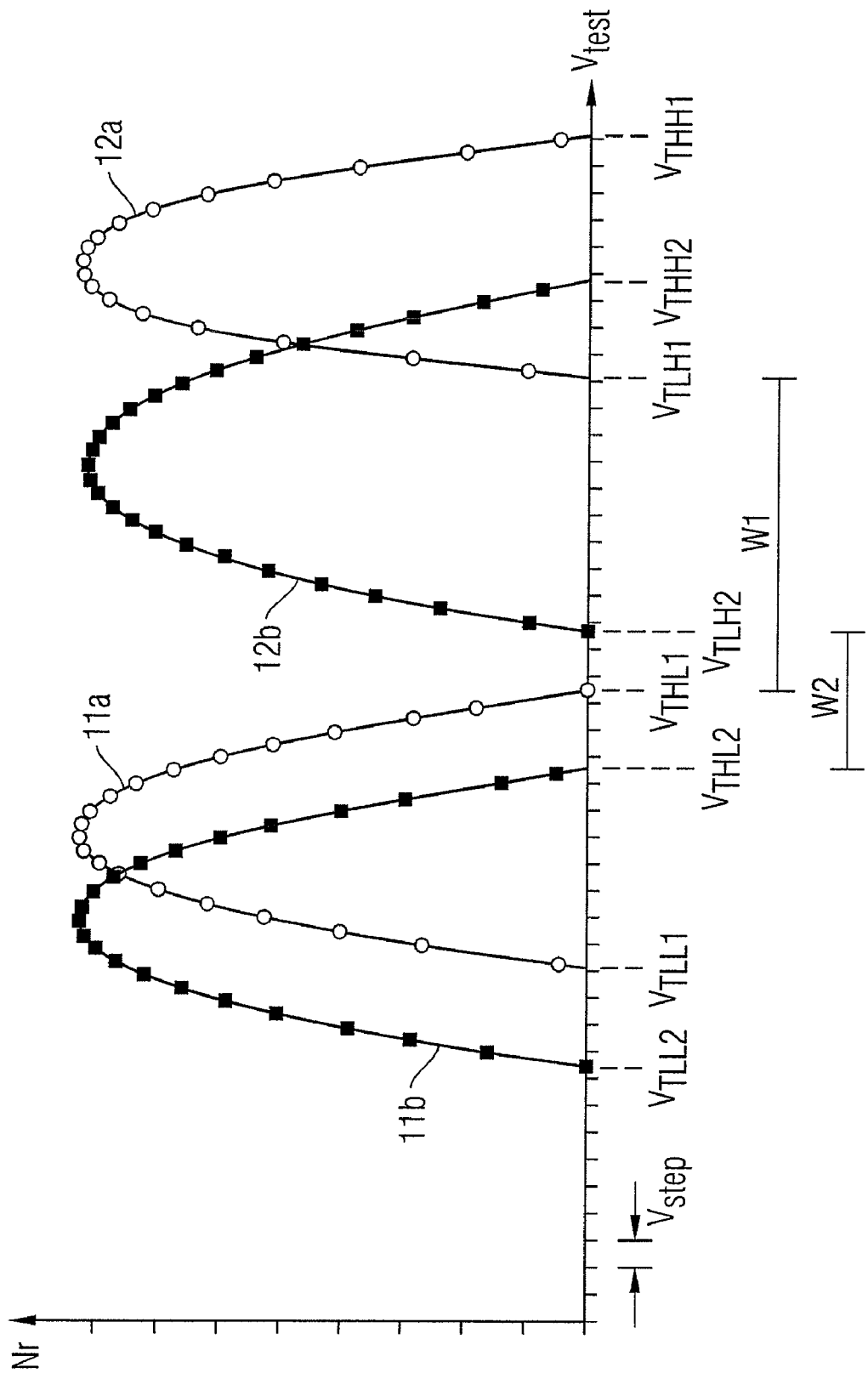
FIG. 1 is a diagram illustrating threshold voltage distributions of a cell array with a plurality of binary memory cells both for a programmed state of the memory cells and for an erased state of the memory cells at the beginning and at the end of lifetime of the cell array respectively.
Figure 2:
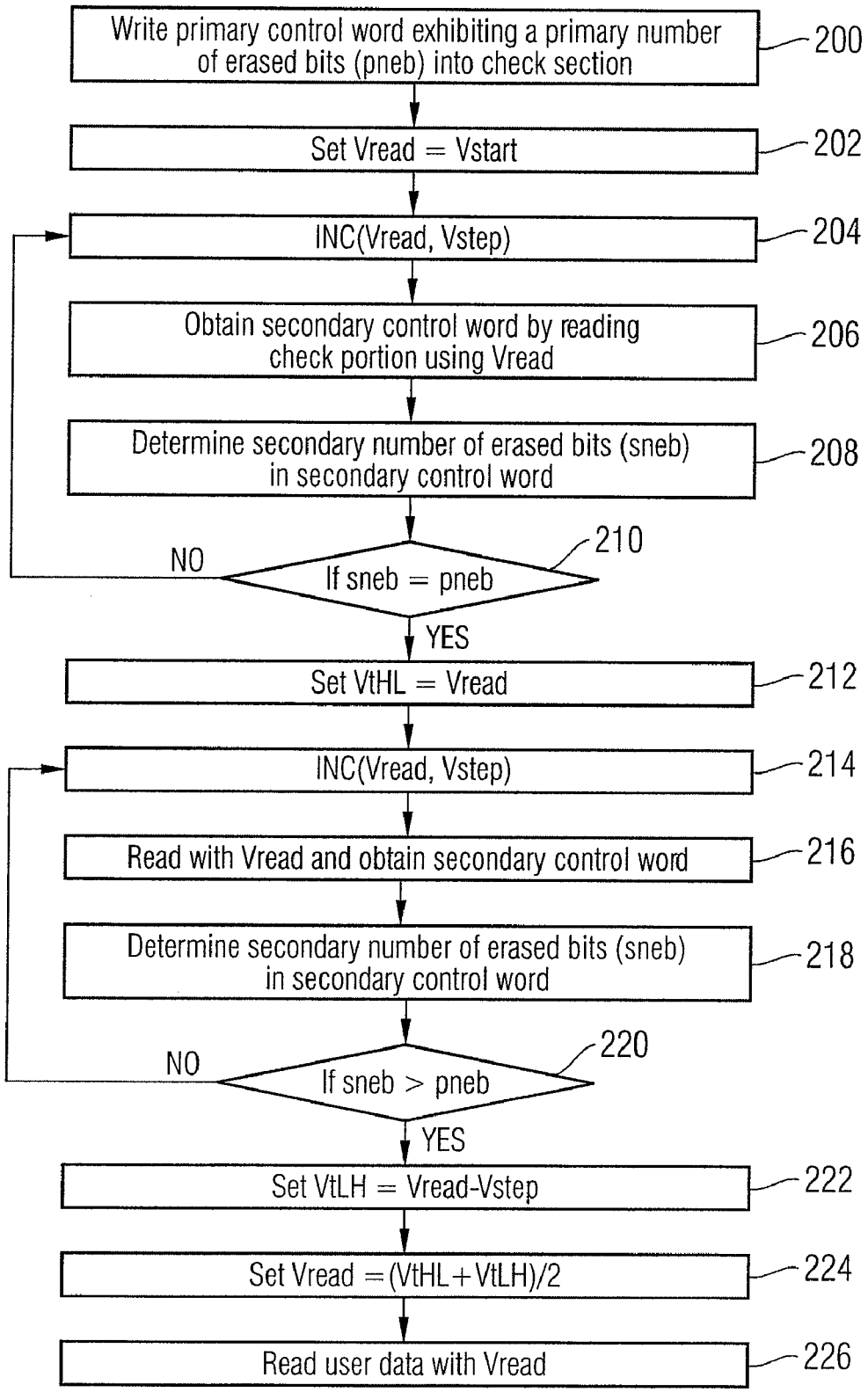
FIG. 2 is a flow chart of a method of tracking a sense window of a cell array that comprises programmable/erasable memory cells through a full sense window search according to an exemplary embodiment.

FIG. 2 refers to a method of determining the sense window of a threshold voltage distribution by a full sense window search that may be triggered by a power-on of the cell array, by a signal generated periodically by a counter or timer unit or by a signal generated by an error detection unit each time an uncorrectable failure occurs.

The cell array comprises, by way of example, binary or multi-bit cells that have a storage layer. A memory controller transmits a user data block that may be physically scrambled to a semiconductor memory device comprising the cell array. The user data block is written into first memory cells, which may be assigned to a user data section of the cell array. The size of the user data block may correspond to a page size of the cell array, for example 512 bytes.

A primary control word is generated that is assigned to the user data block. The primary control word may be derived from the corresponding user data block by counting the number of bits exhibiting a first predetermined state. For a cell array with binary memory cells, the first predetermined state may be the erased state or the programmed state. For a cell array with 4-bit cells each of the four states may be the first predetermined state and one or two of the other three states the other predetermined state. If, by way of example, the states "00", "01", "10", "11" follow another according to increasing read voltage, the first predetermined state may be "10" and the other predetermined state either "01" or "11". If the first predetermined state is "00" the other predetermined state is "01". In the following, the first predetermined state may be the erased state of a binary cell or the "00"-state of the above described 4-bit cell, by way of example, wherein these states are referred to as "zero" for simple reference. Accordingly, the other state may be the programmed state of a binary cell or the "01"-state of a 4-bit cell and will be referred to as "one" in the following for simple reference. In the following, the zeros and ones may also stand for other corresponding states of other multi-bit cells.

While the user data block is written into the user data section, the number of bits of the predetermined state, in this example the number of zeros, may be stored as a binary check sum. The length of the binary check sum results from the size of the user data block and may correspond for binary cells to the logarithm to the basis two of the user data block size in bits. By way of example, the binary check sum comprises 13 bits for a 512 byte user data block. The binary check sum represents one half of the primary control word. The second half of the primary control word may result from inverting the first half bit by bit. By way of example, the primary control word has a predetermined length of 26 bits and comprises 13 zeros and 13 ones. The primary control word is stored in a check section of the cell array (step 200). In this way, a primary number of bits exhibiting the predetermined state is determined by the half of the length of the primary control word.

With regard to 4-bit cells, the second half of the primary control word results from forming for each digit of the first half the corresponding state, for example the "01"-state for a "00"-state and the "00"-state for the "01"-state.

The full sense window search comprises reading the check section at different values of a read voltage Vread, where Vread is altered in a predetermined way. According to the example as illustrated in FIG. 2, the predetermined way of altering Vread is setting Vread equal to a start voltage and then steadily incrementing the read voltage Vread in constant steps. The start voltage may be determined by analyzing the lower sense window limit of comparable cell arrays of the same technology and setting the start voltage equal to a voltage which is definitely below the lower sense window limit reduced by a step voltage Vstep (202).

The step voltage Vstep is usually predetermined by the resources on the memory device or in an external test apparatus. Usually, a voltage source for supplying the read voltage is programmable in steps of, for example, 50 mV in order to facilitate an adjustment of the read voltage within a sense window and in order to track the read voltage to a shift of the sense window during the life cycle of the memory device.

The read voltage Vread may then be incremented by the step voltage (204) such that in the following a test voltage Vtest equal to the start voltage Vstart is applied to the memory cells of the cell array (206). Other embodiments may provide the first incrementing (204) after the first comparison (210).

The check section of the cell array is read by applying the read voltage Vread to the control gates of memory cells assigned to the check section to update the secondary control word. A secondary number of bits exhibiting the predetermined state in the new secondary control word may be determined (208) and compared with the primary number of bits exhibiting the predetermined state in the corresponding primary control word (210). In this example, the number of zeros in the primary control word is compared with the number of zeros in the secondary control word. Since the start voltage Vstart is selected such that in the beginning Vread falls definitely below the lower sense window limit, at least one of the erased cells may still be non-conductive such that the at least one erased cell is detected as being programmed. Initially, the number of ones in the secondary control word will exceed the number of zeros.

As long as the number of ones is not equal to the number of zeros, the read voltage is further incremented by the step voltage (204) again, a new secondary control word is read from the check section (206), and the number of zeros in the new secondary control word is updated (208) and again compared with the number of zeros in the primary control word (210).

The lowest read voltage Vread at which the number of zeros in the secondary control word is equal to the number of zeros in the primary control word is set equal to a lower sense window limit VtHL (212). Within the sense window, all erased memory cells are conductive and are detected as zeros. All programmed memory cells are non-conductive and are detected as ones. As long as the number of zeros does not exceed the number of ones (220), Vread is further incremented by Vstep (214), a new secondary control word is read from the check section (216) and the number of zeros of the secondary control word is updated (218).

The lowest read voltage Vread at which the number of zeros in the secondary control word does not exceed the number of zeros in the primary control word is set equal to an upper sense window limit VtLH (222). By applying a read voltage exceeding the upper sense window limit VtLH, at least one of the programmed memory cells switches into the conductive state and is detected as zero.

The lower and the upper sense window limits VtHL, VtLH determine an application read voltage according to a predetermined relationship (224). The application read voltage may be, for example, the arithmetic mean of the upper and lower sense window limit. Alternatively, the application read voltage may be obtained according to a weighted mean for anticipating an expected drift of the sense window or for taking into account disturbance mechanisms that may impact the margins to the sense window limits to a different extend. The cell array is read out by using the application read voltage Vread in the following (226). The application read voltage may be valid for a predefined time interval that may range, for example, from 10 to 100 milliseconds.

According to another exemplary embodiment (not shown), a first and a second primary number of bits exhibiting the predetermined state are derived from the primary number of bits exhibiting the predetermined state. For example, the first primary number is set equal to the primary number decremented by a first tolerance number and the second primary number is set equal to the primary number incremented by a second tolerance number. According an exemplary embodiment, the first and the second tolerance numbers are equal. The first and the second tolerance numbers may be "one". In the following, the current secondary number of zeros is compared with the first primary number when the lower sense window limit is determined (210) and is compared with the second primary number when the upper sense window limit is determined (220). As a consequence, a single outlier within the check section does not affect the margins of the rest of the memory cells. If the predetermined state is the programmed state, the first primary number is set equal to the predetermined number incremented by the first tolerance number and the second primary number is set equal to the predetermined number decremented by the second tolerance number.

The order of determining the lower sense window limit and the upper sense window limit may be altered, wherein the start voltage may be set equal to a voltage exceeding definitely the upper sense window limit. In this case, the test voltage is decremented, wherein the determination of the sense window limits follows the rules described above accordingly. Instead of checking the secondary number of erased bits, the secondary number of programmed bits may be checked, wherein the upper sense window limit is determined by the highest read voltage at which the secondary number of programmed bits does not fall below the primary number of programmed bits and wherein the lower sense window limit is determined by the lowest read voltage at which the secondary number of programmed bits does not exceed the primary number of programmed bits. According to an alternative embodiment, the predetermined way of altering the read voltage may comprise iteratively incrementing and decrementing the read voltage by a multiple of a step voltage, respectively wherein direction and amount of each alteration is calculated in dependence on the previously obtained secondary number of bits exhibiting the same state, respectively. In this way, the time required for determining the sense window limits may be reduced.

According to a further embodiment, a reference sense current may be obtained by averaging a sense current of second memory cells assigned to the currently effective control word. In the following, reading of the corresponding first memory cells comprises comparing a sense current delivered from the first memory cells with the reference sense current. This embodiment facilitates both a fast read speed and high sense accuracy, wherein the impact of outliers is restricted.

The described method of reading a cell array is suitable for each type of cell array that comprises a plurality of memory cells exhibiting at least a first and a second state, wherein the first and the second state are distinguishable by a response to a sense signal applied to the memory cell and wherein a threshold value of the sense signal depends on a data content of the respective memory cell. For non-volatile cell arrays, the sense signal corresponds to a read voltage and the sense signal amplitude to a read voltage level. With regard to a binary cell, the at least two distinguishable states may correspond to the conductive and the non-conductive state respectively. With regard to a 4-bit cell, four distinguishable states correspond to four states of different conductivity. According to an embodiment, the cell array is an erase section of an electrically erasable programmable memory device of a, for example nitride-based, trapping layer type.

The method may be implemented as a test program being executed in an external test apparatus or in a built-in circuitry within the respective memory device by way of example. The secondary number of bits exhibiting the predetermined state may be counted via a counter unit that is connected to an adaptive sense unit being provided within the memory device. The adaptive sense unit may be a centralized one controlling the test sequence for all cell arrays within the memory device or a distributed one, wherein each cell array of the memory device is assigned to one adaptive sense unit and wherein each adaptive sense unit is assigned to one cell array. As the check section comprises a comparable small number of memory cells, the required circuitry may be comparable simple and does not require much resources with regard to space and test time. The counter unit that is assigned to a page of the cell array may be a simple four digit counter.

Figure 3:
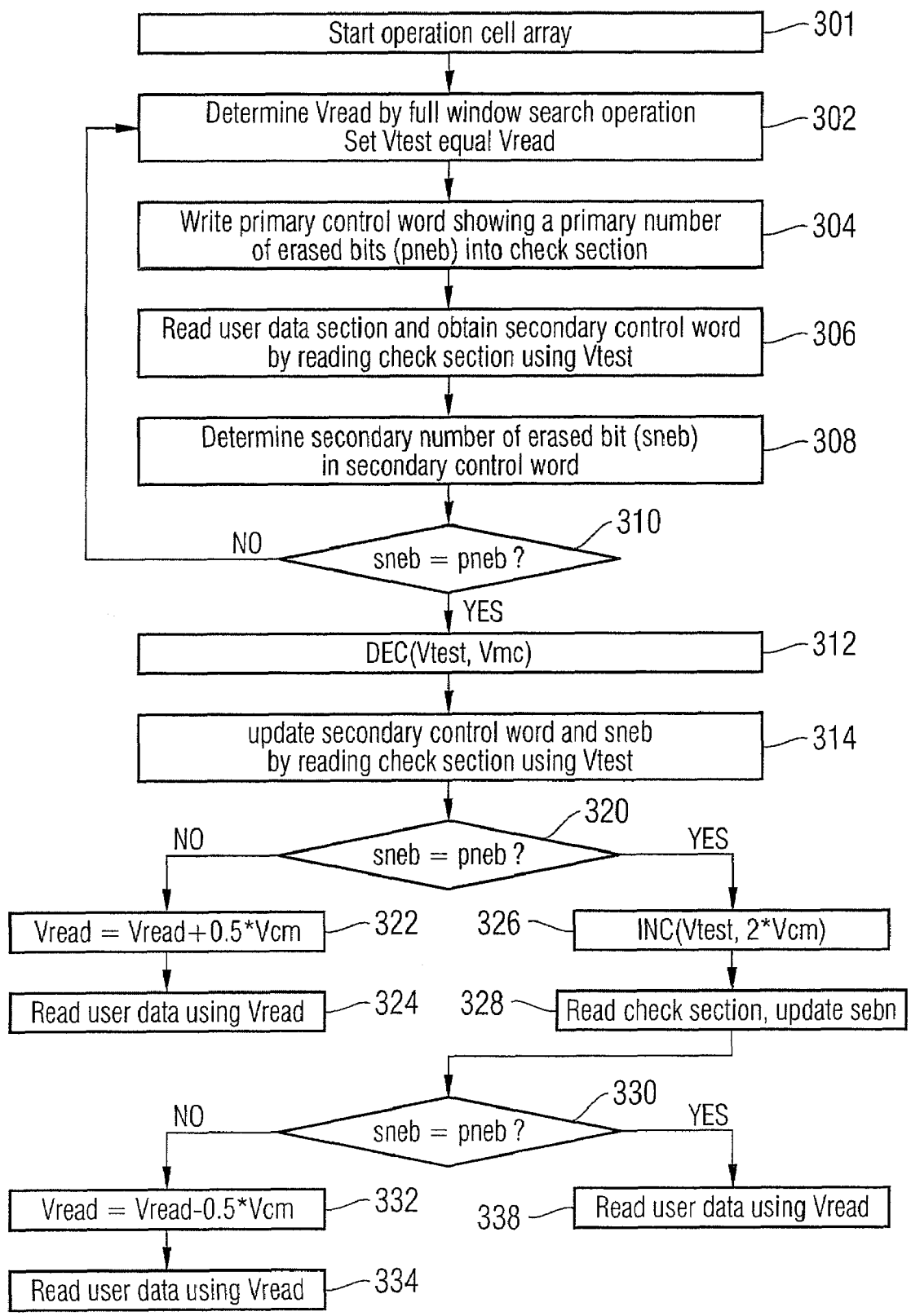
FIG. 3 is a flow chart of a method of adapting a sense window of a cell array that comprises programmable/erasable memory cells via an abbreviated sense window check and search method according to another exemplary embodiment.

FIG. 3 refers to a method of reading a cell array by steadily adapting the sense window during operation of the memory device. Terms and aspects that are yet discussed broadly with regard to FIG. 2 are taken up only briefly.

After power-up of a memory device comprising a cell array (301), a full sense window search may be executed as described with regard to FIG. 2. An application read voltage that may be derived from the above described method may be valid for a predefined time interval. A test voltage may be set equal to the application read voltage (302). During operation of the cell array, a primary control word is derived from the input data stream and written into a check section of the cell array as yet described (304). The primary control word comprises a predetermined primary number of bits exhibiting a predetermined state. In this example, the predetermined state is the conductive state of the memory cells, wherein conductive memory cells are interpreted as being erased each time a suitable application read voltage is applied. Further according to this example, the primary number of bits exhibiting the predetermined state is equal to a number of bits exhibiting the inverted state. According to an exemplary embodiment, the primary control word comprises 13 zeros and 13 ones.

In the operation mode of the cell array, the check section is read periodically and essentially contemporaneously with the user date section (306), wherein secondary control words are obtained, respectively. In the secondary control words, secondary numbers of bits exhibiting the predetermined state are determined, respectively (308). In this example, the secondary number corresponds to the number of zeros in the secondary control word. The primary number is compared with the secondary number (310). If the primary and the secondary number are unequal, the application read voltage is obviously out of the currently effective sense window and the full sense window search (302) may be repeated to determine a read voltage with better margins towards the upper and lower sense window limits. If the primary number is equal to the secondary number, the margins of the currently effective read voltage may be checked as described in the following.

A test voltage is determined by decrementing the application read voltage by a margin check voltage Vmc, which may be a multiple of the step voltage Vstep (312). In this example, the margin check voltage Vmc is twice the step voltage Vstep. A secondary control word is read from the check section and the secondary number of bits exhibiting the predetermined state in the secondary control word is updated (314). The updated secondary number is compared with the primary number (320). If the primary and the secondary numbers are unequal, the margin of the currently effective read voltage towards the lower sense window limit has become narrow and may be broadened by incrementing the read voltage. With reference to the currently effective read voltage, the read voltage is obtained by incrementing by three times the step voltage (322). Referring to the initial application read voltage, the new application read voltage may be obtained by incrementing the initial application read voltage by half of the margin check voltage Vmc. For the following read operations of the cell array, the new application read voltage Vread is valid (324).

If the primary is equal to the secondary number, the margin of read voltage towards the lower sense window limit is sufficient and the margin towards the upper sense window limit may be checked in the following. For this purpose, the test voltage may be incremented, for example by twice the margin check voltage Vmc (326). A new secondary control word is read from the check section and the secondary number of bits exhibiting the predetermined state in the secondary control word is updated (328). The primary number is compared with the updated secondary number (330). If the primary and the secondary number are unequal, the margin of the application read voltage Vread towards the upper sense window limit has become narrow and may be broadened by decrementing the application read voltage Vread with reference to the initial read voltage by, for example, half of the margin check voltage Vmc. In this example, the new application read voltage may be obtained by decrementing the initial application read voltage by the step voltage (332). For the following read operations of the cell array, the new application read voltage is valid (334).

If the primary number and the secondary number are equal, the margin of the initial application read voltage towards the upper sense window limit is sufficient and the initial application read voltage may remain valid until a further sense window check is triggered. The check of the margin to the upper sense window limit may be omitted, if the sense window shifts definitely towards lower values. The order of the checks for the lower margin and the upper margin may be altered. Instead of checking the secondary number of erased bits the secondary number of programmed bits may be checked.

Figure 4:
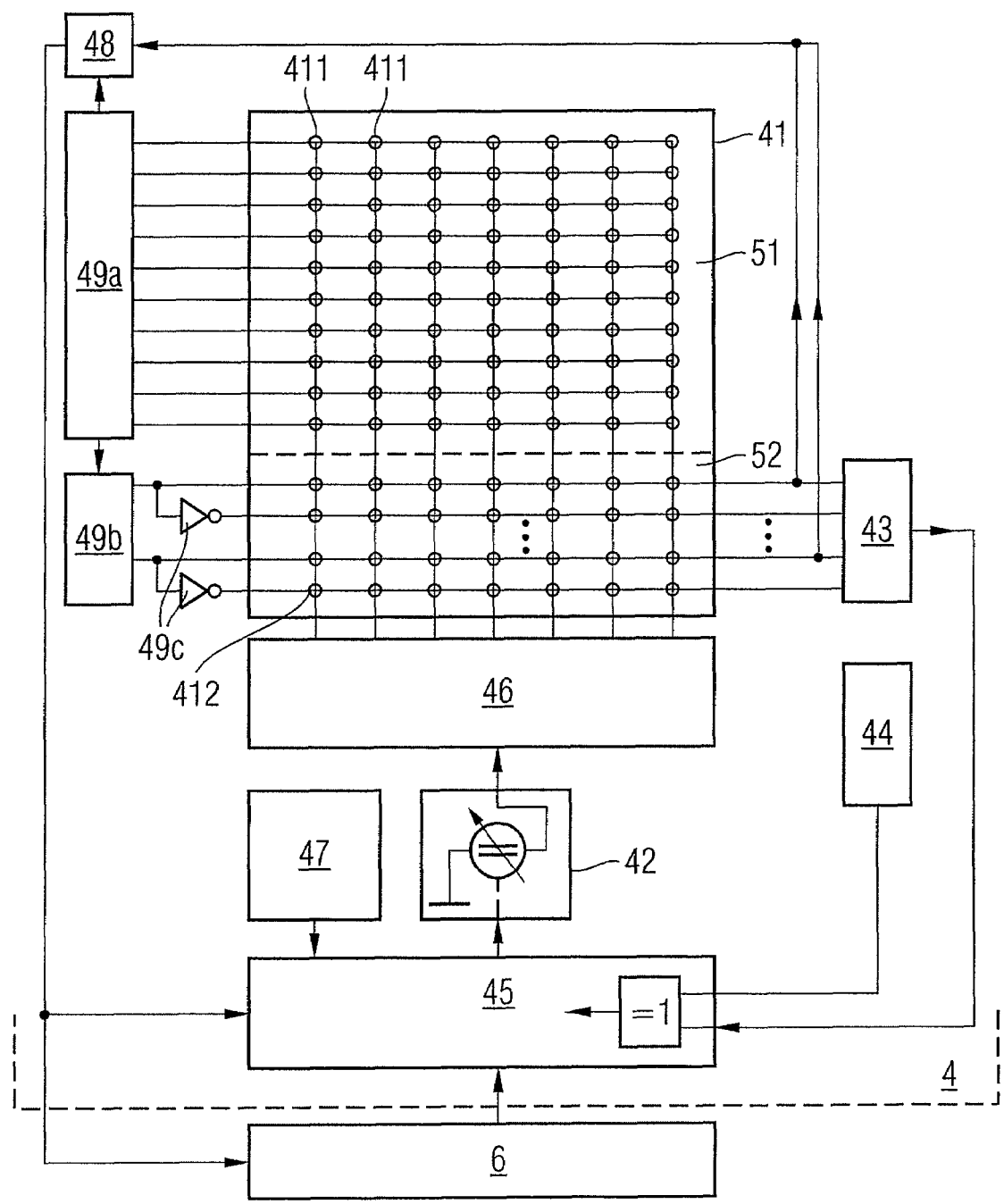
FIG. 4 is a schematic block diagram of a memory device comprising an adaptive sense unit according to a further exemplary embodiment.

FIG. 4 refers to an integrated circuit, for example a semiconductor memory device 4, that is suitable for the execution of the methods as described with regard to FIGS. 2 to 3. The memory device 4 may comprise a cell array 41, an adjustable read voltage source 42, a counter unit 43, a storage unit 44 and an adaptive sense unit 45. The cell array 41 comprises first memory cells 411 that may be assigned to a user data section 51 and second memory cells 412 that may be assigned to a check section 52. A sense/driver unit 49a may be assigned to the user data section 51 and is configured to programming, erasing and reading the first memory cells 411. A driver unit 49b may be assigned to the check section 52 and is configured to determine a primary control word. The primary control word may be derived from a user data block that is written into the user data section 51. A first half of the primary control word may be determined by the content of a binary counter value representing the number of bits exhibiting a predetermined state in the corresponding user data block. Inverter devices 49c may be provided to invert bit-by-bit the binary counter value in order to obtain a second half of the primary control word.

The adjustable read voltage source 42 supplies a read voltage Vread and may be connected to the memory cells 411, 412 via a selector unit 46. The counter unit 43 is configured to determining a number of bits exhibiting a predetermined state in secondary control words that are obtained by reading the check section 52. The counter unit 43 may comprise a simple four digit counter triggered by bits of the predetermined state in the secondary control word. The storage unit 44 holds the primary number of bits exhibiting the predetermined state. Since the primary number is predetermined by the circuitry, the storage unit 44 may, but does not have to, be a simple fixed latch.

The adaptive sense unit 45 may be connected to the counter unit 43 and the read voltage source 42. The adaptive sense unit 45 controls the read voltage source 42 and controls a process for determining a lower and an upper sense window limit of the read voltage by reading out the check section at different read voltages and by comparing the secondary numbers of bits of the predetermined state in the secondary control words with the primary number of bits exhibiting the predetermined state in the primary control word.

The lower sense window limit may be determined as the lowest read voltage at which the secondary number of bits exhibiting the predetermined state in the secondary control word and the primary number of bits exhibiting the predetermined state in the primary control word are equal. The upper sense window limit may correspond to the highest read voltage at which the number of bits exhibiting the predetermined state in the secondary control word is equal to the number of bits exhibiting the predetermined state in the primary control word.

A timer unit 47 may be connected to the adaptive sense unit 45. The timer unit 47 may be configured to triggering periodically a process of determining the lower and the upper sense window limit and/or the margins of the currently effective application read voltage towards the lower and/or upper sense window limits.

The memory device 4 may further comprise an error detection unit 48 that is configured to indicating bit failures in user data blocks stored in the user data section 51. According to an exemplary embodiment, the error detection unit 48 is configured to analyze a stored user data block by counting the number of bits exhibiting the predetermined state and comparing the obtained number with the binary counter value. If, in the user data block, the number of bits exhibiting the predetermined state deviates from the stored number, an uncorrectable bit failure may be communicated to a memory controller 6. According to a further exemplary embodiment, the error detection unit 48 is configured to triggering the process of determining the lower and the upper sense window limit or and/or the margins of the currently effective read voltage towards the lower and/or upper sense window limits if a bit failure occurs. The error detection unit may include an error correction circuitry.

According to another embodiment, the adaptive sense unit 45 is suitable of programming the read voltage source 42 in dependence on the lower and upper sense window limits. For example, the adaptive sense unit 45 may set the read voltage according to the arithmetic mean of the lower and upper sense window limits.

While the embodiments have been described in detail, it will be apparent to one skilled in the art that various changes and modifications can be made therein without departing from the spirit a and scope thereof.

What is claimed is:

1. A method of reading a memory cell array, comprising:
providing a memory cell array including user data and check sections, each of the user data and check stations including memory cells with at least two states that are distinguishable by a response to a sense signal;
writing a primary control word into one of the check sections, the primary control word comprising a predetermined primary number of bits of a predetermined state;
generating new secondary control words by changing a sense signal applied to the check section;
setting a lower range and an upper range of the sense signal to define a sense signal window, wherein the upper and lower ranges of the sense signal are determined by analyzing the new secondary control words;
changing an application sense signal based upon a predetermined relationship between the lower range and the upper range for the sense signal window; and
applying the changed application sense signal to read a user data section of the cell array.

2. The method of claim 1, wherein the predetermined number of bits of the predetermined state is equal to half a total number of bits of the primary control word.

3. The method of claim 1, wherein the predetermined relationship is the arithmetic mean of the lower and upper ranges for the sense signal window.

4. The method of claim 1, wherein applying a sense signal amplitude that exceeds the lower range for the sense signal window results in a detection of at least a specified number of memory cells exhibiting the first state, and applying a sense signal amplitude that is below the upper range for the sense signal window results in a detection of at least a specified number of memory cells exhibiting the second state.

5. The method of claim 4, wherein determining the lower and the upper ranges for the sense signal window comprises:
deriving a first primary number and a second primary number from the primary number of bits of the predetermined state;
determining a number of bits exhibiting the predetermined state in each secondary control word, wherein a secondary number of bits of the predetermined state is determined for each secondary control word;
setting the lower range of the sense signal window equal to a lowest sense signal amplitude at which the secondary number is equal to the first primary number; and
setting the upper range of the sense signal window equal to a highest sense signal amplitude at which the secondary number is equal to the second primary number.

6. The method of claim 5, wherein the first and the second primary numbers of bits exhibiting the predetermined state is set equal to the primary number of bits exhibiting the predetermined state.

7. The method of claim 5, wherein the predetermined state is the first state, the first primary number of bits exhibiting the first state is set equal to the primary number of bits exhibiting the first state decreased by a tolerance number, and the second primary number of bits exhibiting the first state is set equal to the primary number of memory cells exhibiting the first state increased by the tolerance number.

8. The method of claim 5, wherein the predetermined state is the second state, the first primary number of bits exhibiting the second state is set equal to the primary number of bits exhibiting the second state increased by a tolerance number, and the second primary number of bits exhibiting the second state is set equal to the primary number of bits exhibiting the first state decreased by the tolerance number.

9. The method of claim 4, wherein the changing of the application sense signal based upon a predetermined relationship between the lower range and the upper range for the sense signal window comprises steadily increasing or decreasing the sense signal amplitude from a predetermined start value.

10. The method of claim 4, wherein the changing of the application sense signal based upon a predetermined relationship between the lower range and the upper range for the sense signal window comprises:
   assigning a sense signal amplitude a predetermined start value; and
   iteratively increasing or decreasing the sense signal amplitude by a multiple of a step voltage, wherein direction and amount of each iterative increase or decrease of the sense signal amplitude is calculated based upon a previously determined secondary number of bits exhibiting the same state.

11. A method of reading a memory cell array, comprising:
   providing the memory cell array with a user data section and a check section, each of which include memory cells with at least two distinguishable states;
   writing a primary control word into the check section, the primary control word comprising a predetermined primary number of bits of a predetermined state;
   applying different read voltages to read secondary control words from the check section;
   analyzing the secondary control words to determine an upper sense window limit and a lower sense window limit; and
   setting the read voltage based upon a predetermined relationship between the lower and upper sense window limits in order to read the user data section.

12. The method of claim 11, wherein the read voltage is changed in a predetermined manner to read the secondary control words from the check section.

13. The method of claim 11, wherein the lower and upper sense window limits are determined by:
   counting bits of the predetermined state in each secondary control word, wherein a secondary number of bits of the predetermined state is determined for each secondary control word; and
   determining a read voltage based upon a predetermined relationship of the primary number and the secondary number.

14. The method of claim 11, wherein the memory cell array comprises an erase section of a nitride-based trapping-layer-type electrically erasable programmable memory device.

15. The method of claim 11, wherein determining the upper and lower sense window limits comprises:
   deriving a first primary number from the predetermined primary number of bits of the predetermined state and a second primary number from a predetermined number of bits of a second state;
   setting the lower sense window limit equal to a lowest read voltage at which the secondary number is equal to the first primary number; and
   setting the upper sense window limit equal to a highest read voltage at which the secondary number is equal to the second primary number.

16. The method of claim 15, wherein the first and second primary numbers are set equal to the predetermined primary number of bits of the predetermined state.

17. The method of claim 15, wherein the first primary number is set equal to the predetermined primary number of bits of the predetermined state decreased by a tolerance number and the second primary number is set equal to the predetermined primary number of bits of the predetermined state increased by the tolerance number.

18. The method of claim 15, wherein the first primary number of bits of the predetermined state is set equal to the predetermined primary number of bits of the predetermined state increased by a tolerance number and the second primary number of bits of the second state is set equal to the predetermined primary number of bits of the predetermined state decreased by the tolerance number.

19. The method of claim 13, wherein
   a reference sense current is determined by averaging a sense current of memory cells of the check section that are assigned to a currently effective control word; and
   memory cells of the user section are read by comparing the reference sense current with a sense current delivered from the memory cells of the user section.

20. The method of claim 12, wherein the predetermined manner of changing the read voltage comprises:
   setting the read voltage to a predetermined start voltage; and
   steadily increasing or decreasing the read voltage in steps defined by a step voltage.

21. The method of claim 12, wherein the predetermined manner of changing the read voltage comprises:
   setting the read voltage to a predetermined start voltage; and
   iteratively increasing or decreasing the read voltage by a respective multiple of a step voltage, wherein direction and amount of each iterative increase or decrease of the read voltage is calculated based upon previously determined secondary numbers of erased bits or programmed bits.

22. The method of claim 11, wherein the primary control word is written into the check section with each data word that is written into the user data section.

23. The method of claim 22, wherein the check section is read with each reading of the user data section.

24. The method of claim 11, further comprising:
   periodically checking a number of bits of the predetermined state in the secondary control word; and
   repeating a determination of the upper and lower sense window limits and a setting of the application read voltage when the number of bits of the predetermined state in the secondary control word differs from the number of bits of the predetermined state in the primary control word.

25. The method of claim 24, further comprising:
   performing the following steps when the number of bits of the predetermined state in the secondary control word is equal to the number of bits of the predetermined state in the primary control word:
   decreasing the application read voltage by a margin check voltage;
   reading a lower secondary control word from the check section; and
   determining the number of bits of the predetermined state in the lower secondary control word; and
   increasing the application read voltage by more than the margin check voltage when the number of bits of the predetermined state in the lower secondary control word is not equal to the number of bits of the predetermined state in the primary control word.

26. The method of claim 25, further comprising:
performing the following steps when the number of bits of the predetermined state in the secondary control word is equal to the number of bits of the predetermined state in the primary control word:
increasing the application read voltage by a margin check voltage;
reading an upper secondary control word from the check section; and
determining the number of bits of the predetermined state in the upper secondary control word; and
decreasing the application read voltage by more than the margin check voltage when the number of bits of the predetermined state in the upper secondary control word is not equal to the number of bits of the predetermined state in the primary control word.

27. The method of claim 13, further comprising:
checking stored user data words in the user section with an error detection unit, wherein the lower and the upper sense window limits are determined and the application read voltage is set when a non-correctable error is detected by the error detection unit.

28. The method of claim 13, wherein determining the lower and upper sense window limits are triggered by a power-up of the cell array and/or by an external control signal.

29. The method of claim 28, wherein a timer unit periodically generates the external control signal.

30. The method of claim 13, wherein the cell array is disabled when a window span between the lower and the upper sense window limits falls below a predetermined minimum operation span.

31. A memory device comprising:
a cell array comprising user data sections and check sections, each of which comprises memory cells;
an adjustable read voltage source adapted to supply different read voltages to the check section to generate secondary control words; and
a sense unit adapted to read the secondary control words at the different read voltages to determine a lower limit and an upper limit of the read voltage.

32. The memory device of claim 31, further comprising:
a counter unit configured to determine a number of bits exhibiting a predetermined state in the secondary control words; and
a storage unit configured to store the number of bits exhibiting the predetermined state.

33. The memory device of claim 31, wherein the sense unit is configured to determine the lower and the upper limits of the read voltage by comparing the number of bits of the predetermined state in the secondary control word with a primary number of bits of the predetermined state in a primary control word that is stored in the check section.

34. The memory device of claim 33, wherein the sense unit is adapted to determine the lower and the upper limit of the read voltage by:
determining the lower limit as the lowest read voltage at which the number of bits exhibiting the predetermined state in the secondary control word and the primary number are equal; and
determining the upper limit as the highest read voltage at which the number of bits exhibiting the predetermined state in the secondary control word is equal to the primary number.

35. The memory device of claim 31, further comprising:
a timer unit connected to the sense unit, wherein the timer unit is configured to periodically initiate a determination of the lower and upper limits.

36. The memory device of claim 31, further comprising:
an error detection unit configured to determine bit failures in user data blocks stored in the user data section, and the error detection unit is further configured to initiate a determination of the lower and upper limits each time an uncorrectable bit failure occurs.

37. The memory device of claim 31, wherein the sense unit adjusts the read voltage source based upon the lower and upper limits.

* * * * *